Figure 1:
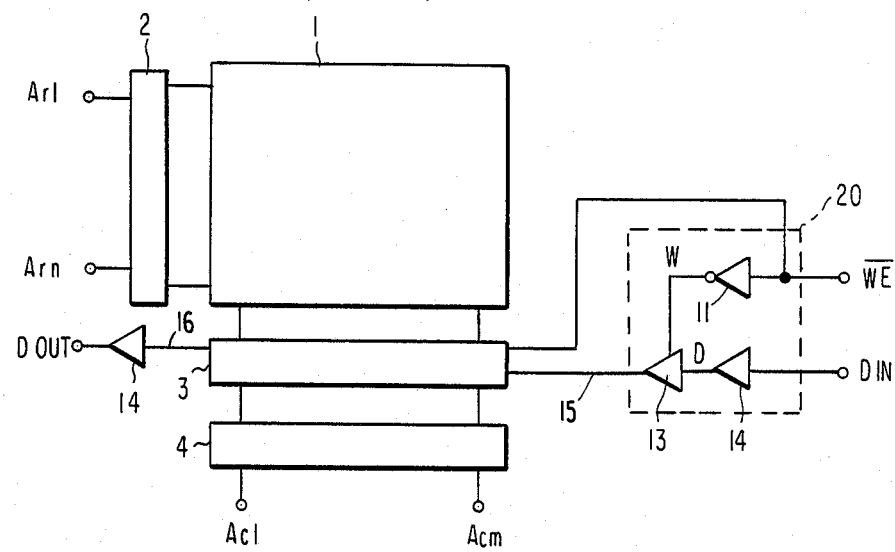

United States Patent [19]

Akatsuka

[11] Patent Number: 4,794,567
[45] Date of Patent: Dec. 27, 1988

[54] STATIC MEMORY INCLUDING DATA BUFFER AND LATCH CIRCUITS

[75] Inventor: Yasuo Akatsuka, Tokyo, Japan

[73] Assignee: NEC Corporation, Tokyo, Japan

[21] Appl. No.: 924,388

[22] Filed: Oct. 29, 1986

Related U.S. Application Data

[63] Continuation of Ser. No. 497,284, May 23, 1983, abandoned.

[30] Foreign Application Priority Data

May 21, 1982 [JP] Japan .................................. 57-85981

[51] Int. Cl.$^4$ .............................................. G11C 7/00
[52] U.S. Cl. .................................... 365/189; 365/190; 365/233
[58] Field of Search ............... 365/189, 190, 194, 195, 365/233

[56] References Cited

U.S. PATENT DOCUMENTS

| | | | |
|---|---|---|---|
| 3,969,706 | 7/1976 | Proebsting et al. | 365/233 |
| 4,075,606 | 2/1978 | Wilkins | 365/189 |
| 4,300,213 | 11/1981 | Tanimura et al. | 365/190 |
| 4,386,419 | 5/1983 | Yamamoto | 365/190 |
| 4,397,001 | 8/1983 | Takemae | 365/189 |
| 4,400,801 | 8/1983 | Kible | 365/189 |
| 4,415,994 | 11/1983 | Ive et al. | 365/189 |
| 4,507,759 | 3/1985 | Yasui et al. | 365/189 |

OTHER PUBLICATIONS

Ahlquist et al., "A 16K Dynamic RAM", IEEE International Solid State Circuits Conference, Digest of Technical Papers, Feb. 19, 1976, pp. 128–129.
Mostek Corp., "An In-Depth Look at the MK 4027", New Electronics, vol. 9, No. 12, pp. 58, 60, 64, Jun. 15, 1976.

Primary Examiner—Stuart N. Hecker
Assistant Examiner—Glenn A. Gossage
Attorney, Agent, or Firm—Sughrue, Mion, Zinn, Macpeak and Seas

[57] ABSTRACT

A static memory circuit which can stably conduct a write operation with large margins is disclosed. The memory circuit comprises a plurality of static type memory cells, a first terminal for receiving input data to be written, a second terminal for receiving a control signal for changing an operation mode of the memory from a read operation mode to a write operation mode, a latch circuit for holding the input data during the write operation mode, and circuitry for applying the held data by the latch circuit to a selected memory cell.

5 Claims, 3 Drawing Sheets

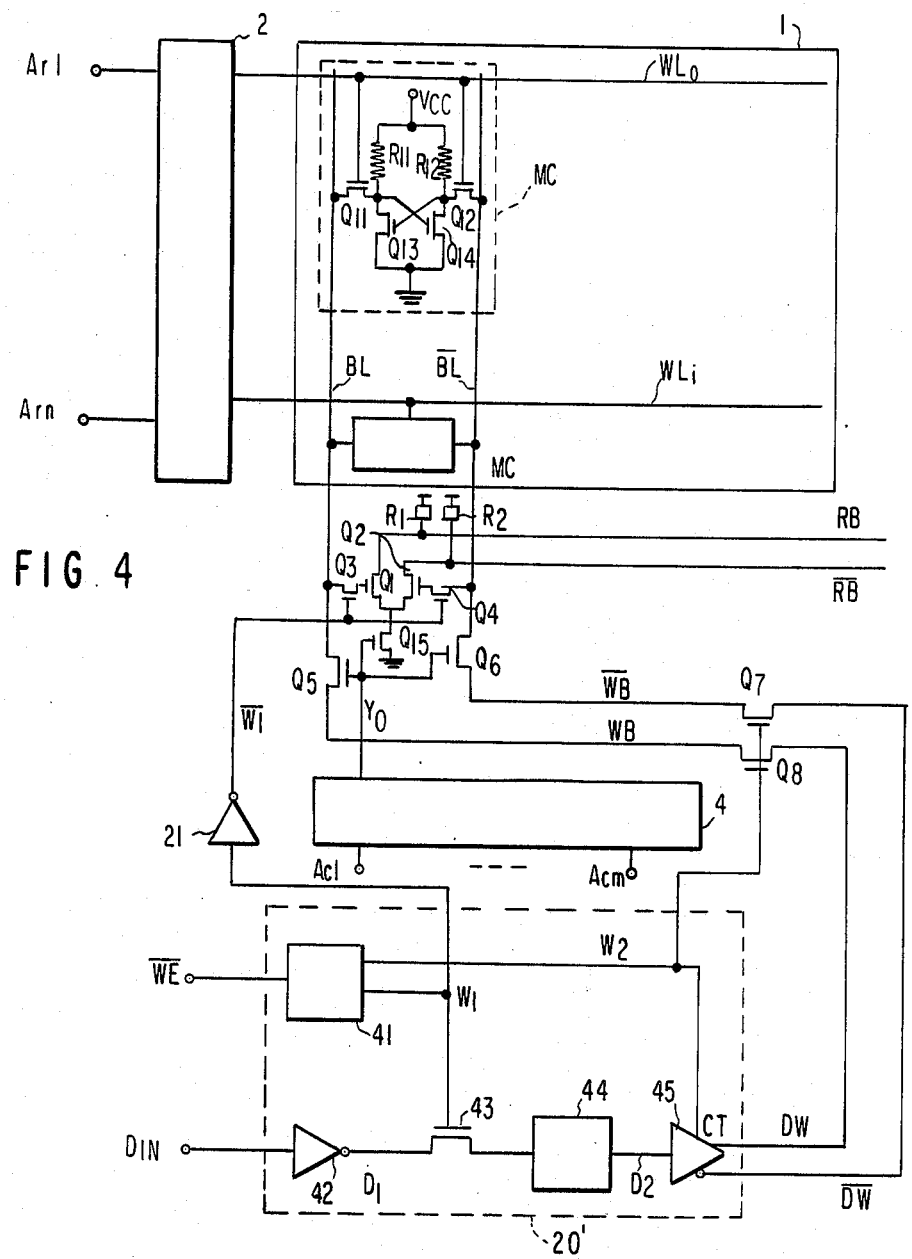
FIG. 4
FIG. 5
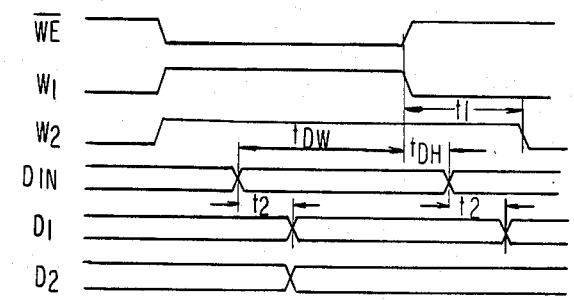

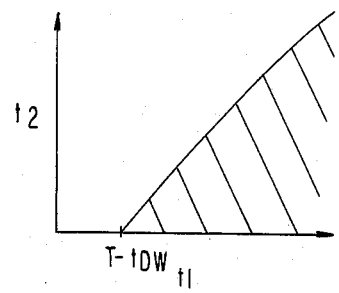
FIG. 6
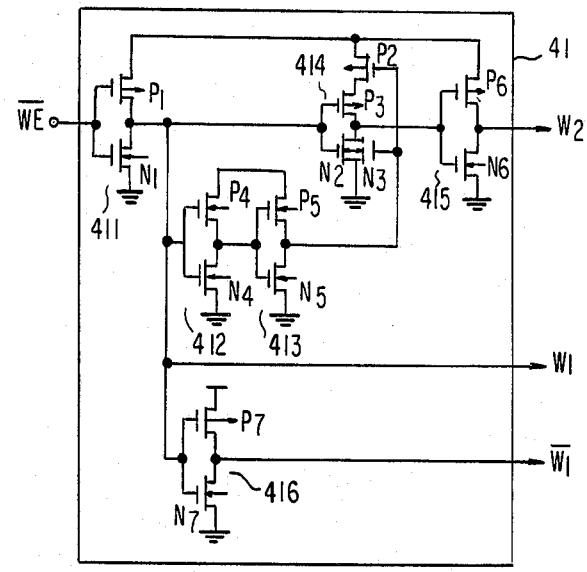
FIG. 7
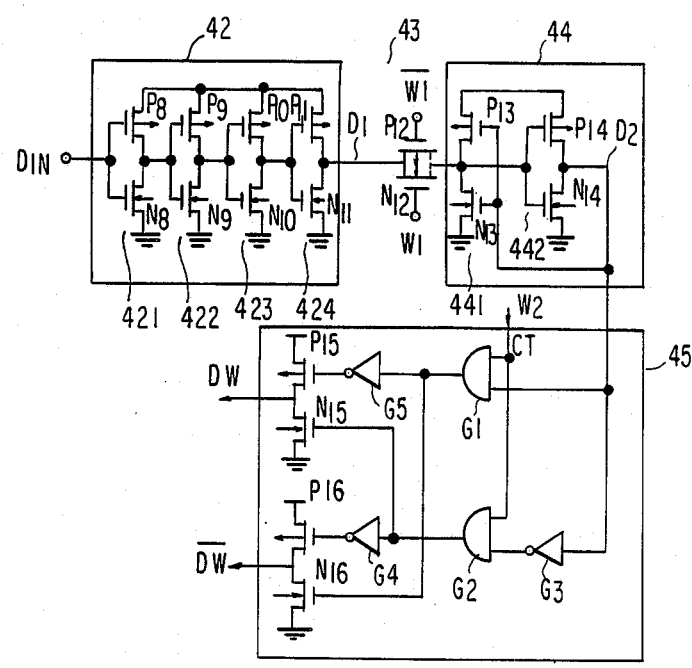

STATIC MEMORY INCLUDING DATA BUFFER AND LATCH CIRCUITS

This is a continuation of application Ser. No. 497,284, filed May 23, 1983, now abandoned.

The present invention relates to a static memory circuit in which access of data is asynchronously conducted, and more particularly to a data write circuit in such static memory circuit.

An asynchronous type static memory is freely accessible under its operating condition, and read or write can be effected for a memory cell at an address designated by address data without being restricted in timing. A write operation is effected when a write control signal is activated and write data is introduced in synchronism with the activation of the write signal, in which the introduced data is written into a memory cell designated by an address signal. Here it is to be noted that in such type of static memories, fixed timing relationship is defined between the write control signal applied externally and the input data signal to be written. More particularly, a time period (data setup time: $t_{DW}$) from the moment when the data signal has become effective up to the moment when the write control signal (hereinafter abbreviated as "write signal") disappears, and a time period (data hold time: $t_{DH}$) from the moment of disappearance of the write signal up to the moment of the data signal becoming ineffective are defined in a static memory. What is meant by such definition is that a predetermined time T is necessary for receiving a data signal and writing it in a selected memory cell and the data signal is prevented from changing during that time T.

In order to fulfill the rated conditions for the time $t_{DW}$ and the time $t_{DH}$, in a static memory in the prior art, a buffer for receiving the write signal was made to have a delay characteristic, another buffer for receiving the input data signal was also made to have a delay characteristic, and the conditions for the time $t_{DW}$ and the time $t_{DH}$ were fulfilled by setting the delay characteristics of these buffers at desired values. However, in the event that the write conditions are fulfilled through such method, the respective delay times of the two buffers cannot be preset independently of each other, but they must be preset relatively within a certain limited range. Accordingly, a freedom in the setting of delay times of the two buffers is small, and consequently, the circuit design is difficult. Moreover, due to fluctuations of the characteristics of circuit elements in manufacture, it was difficult to provide desired delay characteristics, and hence it was also difficult to make an operation margin large.

It is therefore one object of the present invention to provide a static memory circuit that is easy in circuit design and that has a large operation margin.

Another object of the present invention is to provide a static memory circuit in which restriction to a data setup time and a data hold time is small.

The present invention is characterized in that in response to incoming of a write signal a data signal is latched and this latched data signal is held over a period that is necessitated for writing.

A described above, according to the present invention, since a data signal is once latched upon write operation and write operation is executed within a memory circuit on the basis of the latched data signal, the restriction to a delay time of a data input buffer can be largely reduced.

According to one aspect of the present invention, there is provided a memory circuit including an asynchronous type write circuit in which an input data signal is introduced at least during the period when a write signal is active, comprising a control signal generator circuit responsive to the write signal for generating a first control signal and a second control signal whose trailing edge is delayed by a predetermined period with respect to the trailing edge of the first control signal, a delay circuit for generating a delayed data signal of the input data signal, a transfer gate for introducing the delayed data signal as controlled by the first control signal, a data hold circuit for statically holding the introduced delayed signal when the transfer gate is OFF, and a data driver circuit having the output of the data hold circuit applied to its input and controlled by the second control signal.

Figure 2:
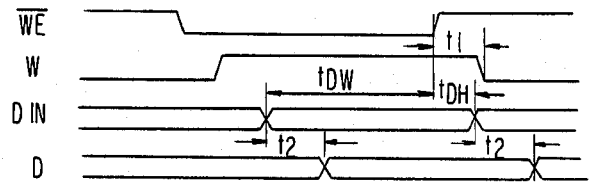
Figure 3:
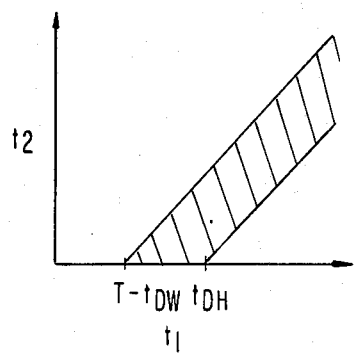

The above-mentioned and other features and objects of the present invention will become more apparent by reference to the following description of a preferred embodiment of the invention taken in conjunction with the accompanying drawings, wherein:

FIG. 1 is a circuit diagram of a memory circuit in the prior art,

FIG. 2 is a timing chart showing an operation sequence in the known memory circuit in FIG. 1, FIG. 3 is a diagram showing a relation between delay times in the memory circuit in the prior art, FIG. 4 is a major circuit diagram of a memory circuit according to one preferred embodiment of the present invention, FIG. 5 is a timing chart showing an operation sequence in the circuit shown in FIG. 4, FIG. 6 is a diagram showing a relation between delay times in the circuit shown in FIG. 4, and FIG. 7 is a more detailed circuit diagram for the component circuitries in the memory circuit illustrated in FIG. 4.

First, description will be made of a static memory circuit in the prior art with reference to FIGS. 1 and 2.

In FIG. 1, a memory cell matrix 1 consists of a plurality of flip-flop type memory cells arrayed in rows and columns, that is, in a matrix form. A row decoder 2 selects one of the rows on the basis of row address signals $A_{rl} \sim A_{rm}$. A column decoder 4 responds to column address signals $A_{cl} \sim A_{cm}$, and upon reading, that is, when a write signal $\overline{WE}$ is a high level, it controls a column selection circuit 3 so that a read signal on a selected column may be transmitted to a read bus 16, while upon writing, that is, when the write signal $\overline{WE}$ is at a low level, it controls the column selection circuit 3 so that an input (write) data signal fed from a write circuit 20 via a write bus 15 may be transmitted to a selected column.

In a static memory circuit in which the above-mentioned operations are effected in an asynchronous manner, a fixed time T necessitated for achieving writing within the memory circuit must be assured and during this period of time T the write data must be maintained. To that end, fixed timing relationship is defined between a write signal and a data signal both applied externally. More particularly, a time period (data setup time: $t_{DW}$) from the moment when the data signal has become effective up to the moment when the write signal disappears, and a time period (data hold time:

$t_{DH}$) from the disappearance of the write signal up to the date signal becoming ineffective, are defined.

In a write circuit 20 for a memory circuit which has been employed in the prior art in order to fulfill the conditions imposed upon the time $t_{DW}$ and the time $t_{DH}$, it has been a common practice that the write circuit 20 is composed of a first delay circuit 11 for generating a control signal W which is an opposite-phase signal to and delayed from the write signal $\overline{WE}$, a second delay circuit 12 for generating a delayed data signal D which is a delayed signal of an input data signal $D_{IN}$, and a data driver circuit 13 having the delayed data signal D applied to its input and controlled by the control signal W, and that the time $t_{DW}$ and the time $t_{DH}$ are preset at desired values by adjusting the delay times $t_1$ and $t_2$, respectively, of the first and second delay circuits 11 and 12. Here, it is to be noted that the two delay times $t_1$ and $t_2$ are not independent of each other, but as will be seen from the timing chart shown in FIG. 2, for a fixed time T that is necessary for a writing operation it is required that the delay times $t_1$ and $t_2$ should fulfill the following relations (1) and (2):

$$t_{DW} - t_2 + t_1 > T \quad t_2 < t_1 - (T - t_{DW}) \quad (1)$$
$$t_{DH} + t_2 > t_1 \quad t_2 > t_1 - t_{DH} \quad (2)$$

Representing the range of values which the delay times $t_1$ and $t_2$ can take to fulfill the above two relations, it is represented by the hatched region in the diagram shown in FIG. 3. In other words, the delay times $t_1$ and $t_2$ are not independent of each other but they must be preset at values within a certain limited region (represented by the hatched area).

As described above, in the prior art, there was a shortcoming that not only a freedom with respect to setting of the delay times $t_1$ and $t_2$ was narrow and accordingly circuit design was difficult, but also margin for fluctuations in manufacture was narrow.

Now description will be made on a memory circuit according to the present invention with reference to FIGS. 4 to 7.

In FIG. 4, a static memory according to the present invention is illustrated. A plurality of memory cells MC are arrayed in a matrix form of word lines $WL_0$ to $WL_i$ coupled to a row decoder 2 and a plurality of pairs of bit lines (BL, $\overline{BL}$). Each of the memory cells MC is composed of a flipflop including load resistors $R_{11}$ and $R_{12}$ and field effect transistors $Q_{13}$ and $Q_{14}$, and a pair of transfer gate transistors $Q_{11}$ and $Q_{12}$. Field effect transistors $Q_1$, $Q_2$, $Q_3$, $Q_4$ and $Q_{15}$ form a gated type sense amplifier together with load elements $R_1$ and $R_2$ which are commonly used for sense amplifiers in the different bit locations. Namely, the transistor $Q_1$, $Q_2$ and $Q_{15}$ form a differential amplifier in which the transistor $Q_{15}$ forms a current source when it is selected by a column selection signal $Y_o$ from a column decoder & receiving column address signals $A_{c1}$ to $A_{cm}$. The transistors $Q_3$ and $Q_4$ are controlled by a signal $W_1$ which is made high in level upon a read operation and low in level upon a write operation, and connect the gates of the transistors $Q_1$ and $Q_2$ to the bit lines BL and $\overline{BL}$, respectively during a read operation. Drains of the transistors $Q_1$ and $Q_2$ are connected to read bus lines RB and $\overline{RB}$, respectively to which drains of the transistors of other sense amplifiers are connected in the same manner. The bit lines BL and $\overline{BL}$ are connected to write bus lines WB and $\overline{WB}$ through column selection transistors $Q_5$ and $Q_6$ receiving the column selection signal $Y_o$, respectively. The write bus lines WB and $\overline{WB}$ are connected to true and complementary outputs DW and $\overline{DW}$ from a write circuit 20' through transfer gate transistors $Q_8$ and $Q_7$, respectively. The transistors $Q_7$ and $Q_8$ are controlled by a signal $W_2$ from the write circuit 20'. The write circuit 20' is composed of a control signal generator circuit 41 for generating first and second control signals $W_1$ and $W_2$ in response to a write signal $\overline{WE}$, a delay circuit 42 for delaying a data signal, a transfer gate 43 for introducing a delayed data signal $D_1$ as controlled by the first control signal $W_1$, a data hold circuit 44 for statically holding the introduced delayed data, and a data driver circuit 45 having the held data signal $D_2$ applied to its input and controlled by the second control signal $W_2$ applied at a control terminal CT.

In FIG. 5 is shown a timing chart representing timing relationship of the various signals appearing in the write circuit 20' according to the present invention. In this timing chart, a first control signal $W_1$ is an opposite-phase signal to a write signal $\overline{WE}$, and a second control signal $W_2$ is an opposite-phase signal having its trailing edge delayed by a time $t_1$ with respect to that of the write signal $\overline{W}$. In addition, a delayed data signal $D_1$ which is delayed by a time $t_2$ with respect to a data signal $D_{IN}$ through the delay circuit 42, is introduced into the data hold circuit 44 through the transfer gate 43. The data hold circuit 44 holds the data immediately before the transfer gate is turned OFF, under the condition that the first control signal $W_1$ has become "0" and the transfer gate 43 has been turned OFF. Since the data driver circuit 45 is controlled by the second control signal $W_2$, even after the write signal $\overline{WE}$ has become "1", an enable condition thereof will continue further for a time $t_1$. Accordingly, for a given time T that is necessitated for writing, it is necessary that the following two relations are fulfilled:

$$t_{DW} - t_2 + t_1 > T \quad t_2 < t_1 - (T - t_{DW}) \quad (3)$$
$$t_{DH} + t_2 > 0 \quad t_2 > -t_{DH} \quad (4)$$

If the above relations are represented by a diagram, the range of values which the time $t_1$ and the time $t_2$ can take is limited to the hatched area. More particularly, the condition (4) above is always fulfilled so long as the time $t_{DH}$ and the time $t_2$ both have finite positive values, and hence it is only necessary to preset the values of the time $t_1$ and the time $t_2$ so as to fulfill only the relation (3) above.

As compared to the limited range shown in FIG. 3 in the case of the prior art write circuit 20, the range of the values of the time $t_1$ and the time $t_2$ shown in FIG. 6 remarkably enlarges the freedom in design.

Now, a more detailed construction of the write circuit 20' shown in FIG. 4 which is constructed according to the technique of complementary type insulated gate field effect transistors (CMOS's) will be described with reference to FIG. 7. In FIG. 7, component parts corresponding to the respective circuit components shown in FIG. 4 are denoted by like reference numerals.

In a control signal generator circuit 41, an inverter 411 for receiving a write signal $\overline{WE}$ is formed by a P-channel MOS transistor $P_1$ and an N-channel MOS transistor $N_1$. An inverter 412 formed of a P-channel MOS transistor $P_4$ and an N-channel MOS transistor $N_4$ and an inverter 413 formed of a P-channel MOS transistor $P_5$ and an N-channel MOS transistor $N_5$, function as a delay circuit having a delay time $t_1$, and the delay circuit receives the output of the inverter 41.

A NOR gate 414 constructed of P-channel MOS transistors $P_2$ and $P_3$ and N-channel MOS transistors $N_2$ and $N_3$ has the output of the inverter 411 and the output of the inverter 413 which is a delayed output of the former output applied to its inputs. The output of the NOR gate 414 is output as a control signal $W_2$ through an inverter 415 which is formed of a P-channel MOS transistor $P_6$ and an N-channel MOS transistor $N_6$ and which serves as a buffer. The output of the inverter 411 is output as a control signal $W_1$ and also it is input to an inverter 416 formed of a P-channel MOS transistor $P_7$ and an N-channel MOS transistor $N_7$ to generate a signal $\overline{W}_1$ which has an opposite phase to the signal $W_1$, therefrom.

A delay circuit 42 is constructed by a cascade connection of inverters 421–424 each having a CMOS structure. A transfer gate 43 is constructed of an N-channel MOS transistor $N_{12}$ having the signal $W_1$ applied to its gate and a P-channel MOS transistor $P_{12}$ having the signal $\overline{W}_1$ applied to its gate. A data hold circuit 44 is constructed by cross-connecting the inputs and outputs of an inverter 441 formed of a P-channel MOS transistor $P_{13}$ and an N-channel MOS transistor $N_{13}$ and an inverter 442 formed of a P-channel MOS transistor $P_{14}$ and an N-channel MOS transistor $N_{14}$, respectively.

A data driver circuit 45 includes an AND gate $G_1$ having the output $D_2$ of the inverter 442 and the control signal $W_2$ applied to its inputs and another AND gate $G_2$ having the output of an inverter $G_3$ whose input is connected to the output of the inverter 442 as one input and also having the control signal $W_2$ input thereto, and an inverter formed of a P-channel MOS transistor $P_{15}$ and a N-channel MOS transistor $N_{15}$ is driven by the output of the AND gate $G_2$ and the signal obtained by inverting the output of the AND gate $G_1$ via an inverter $G_5$, to feed a write true data signal DW. Another inverter formed of a P-channel MOS transistor $P_{16}$ and an N-channel MOS transistor $N_{16}$ is driven by the output of the AND gate $G_1$ and the signal obtained by inverting the output of the AND gate $G_2$ via an inverter $G_4$, to feed a write complementary data signal $\overline{DW}$.

In the illustrated embodiment, the drive capability of the inverter 424 is chosen to be larger than the drive capability of the inverter 441 which forms positive feedback means in the data hold in order to set the state of the data hold circuit by the inverter 44 when the transfer gate 43 is ON.

As described above, accordingly to the present invention, a memory circuit having a large manufacturing margin in which the shortcoming of the prior art memory circuit in connection to the data setup time $t_{DW}$ and the data hold time $t_{DH}$ is eliminated, can be provided.

It is to be noted that the present invention should, as a matter of course, not be limited to the above-described preferred embodiment but various changes in design could be made without departing the spirit of the present invention.

I claim:

1. An asynchronous type static memory circuit comprising a plurality of word lines, a plurality of bit line pairs intersecting with said word lines, a plurality of static-type memory cells coupled to said word lines and said bit line pairs, a first terminal for receiving a write command signal, a second terminal for receiving an input data, first means coupled to said first terminal for generating a first control signal in response to said write command signal during a first period which is longer than the period of the presence of said write command signal and terminates a predetermined time after the time point when said write command signal disappears, and a write circuit coupled to said first means and said second terminal for effecting a write operation of said input data to a selected memory cell during said first period, said write circuit including a holding circuit for holding said input data during a second period, said second period overlapping said first period and ending after the end of said first period, and selecting means for selectively applying the input data stored in said holding circuit to the selected memory cell, whereby a period of writing said input data to said selected memory cell is longer than the period of said write command signal, in which said holding circuit includes a first buffer circuit having an input terminal coupled to said second terminal, a latch circuit, a transfer gate coupled between an output terminal of said first buffer circuit and an input terminal of said latch circuit, a control circuit coupled to said first terminal for rendering said transfer gate conductive in response to said write command signal and a second buffer circuit having an input terminal coupled to an output terminal of said latch circuit for generating internal input data to be written into the selected memory cell.

2. An asynchronous type static memory circuit comprising a plurality of static-type memory cells arranged in a matrix form of rows and columns, means for receiving a row address signal, means for receiving a column address signal, first means responsive to said row address signal for selecting one of said rows, second means for selecting one of said columns, a first terminal for receiving a write command signal, a second terminal for receiving input data, a first circuit coupled to said first terminal for generating a first signal during a first period from the initiation of the receipt of said write command signal until a predetermined time point after the disappearance of said write command signal, a second circuit coupled to said first terminal for generating a second signal during a second period from the initiation of the receipt of said write command signal until the disappearance of said write command signal, an input buffer circuit having an input coupled to said second terminal, a latch circuit, a control circuit coupled between an output of said input buffer circuit and an input of said latch circuit for operatively applying a signal produced at the output terminal of said input buffer circuit to said latch circuit in response to said second signal, said latch circuit holding the signal applied thereto during said first period, and a write circuit coupled to said latch circuit for selectively writing the content of said latch circuit to a selected memory cell during said first period in response to said first signal, said first period being longer than said second period.

3. The memory circuit according to claim 2, in which said control circuit includes a transfer gate coupled between said output terminal of said input buffer circuit and said latch circuit, said transfer gate being controlled by said write command signal.

4. An asynchronous type static memory circuit comprising a plurality of memory cells arranged in rows and columns, first means for receiving a write command signal of a first time length, second means for receiving input data, third means responsive to said write command signal for generating a write execution signal of a second time length, said second time length being longer than said first time length, latch means coupled to said second means for holding said input data at least until the time point when said write execution signal disappears, and writing means for selectively effecting a write operation of said input data to a selected memory cell in response to said write execution signal, said second means including a delay circuit which generates an output signal after a first delay time from the time point when said write command signal appears, said output signal disappearing after a second delay time from the time point when said write command signal disappears.

5. An asynchronous type static memory circuit comprising a plurality of memory cells arranged in rows and columns, first means for receiving a write command signal of a first time length, second means for receiving input data, third means responsive to said write command signal for generating a write execution signal of a second time length, said second time length being longer than said first time length, latch means coupled to said second means for holding said input data at least until the time point when said write execution signal disappears, and writing means for selectively effecting a write operation of said input data to a selected memory cell in response to said write execution signal, said third means including an inverter receiving said write command signal, a delay circuit coupled to said inverter for generating a delayed write command signal, a NOR gate receiving an output of said inverter and said delayed write command signal and means coupled to an output of said NOR gate for generating said write execution signal.

* * * * *